United States Patent [19]

van Buul

[11] 4,099,122

[45] Jul. 4, 1978

[54] TRANSMISSION SYSTEM BY MEANS OF TIME QUANTIZATION AND TRIVALENT AMPLITUDE QUANTIZATION

[75] Inventor: Marinus Cornelis Willem van Buul, Eindhoven, Netherlands

[73] Assignee: U.S. Philips Corporation, New York, N.Y.

[21] Appl. No.: 690,647

[22] Filed: May 27, 1976

[30] Foreign Application Priority Data

Jun. 12, 1975 [NL] Netherlands ............... 7506987

[51] Int. Cl.² ........................................... H03K 13/22
[52] U.S. Cl. ................................................. 325/38 B
[58] Field of Search ............... 325/38 B, 62, 321;
333/14; 332/110; 358/133, 135; 179/15.55 R;
340/347 AD

[56] References Cited

U.S. PATENT DOCUMENTS

3,439,753 4/1969 Mounts et al. .................. 358/135
3,631,520 12/1971 Atal .............................. 325/38 B X
3,973,199 8/1976 Widmer ............................ 325/38 B

*Primary Examiner*—Benedict V. Safourek
*Attorney, Agent, or Firm*—Frank R. Trifari; Henry I. Steckler

[57] ABSTRACT

Indicated as hybrid D-PCM a new transmission system is given which is based on differential pulse code modulation (DPCM) with signal compression at the transmitter end and signal expansion at the receiver end.

In the transmitter defined auxiliary information is fed to the DPCM code groups to obtain composite code groups, while in the receiver a local auxiliary signal derived from a reconstruction device is subtracted in a separating device from the received composite signal. With a particularly simple construction hybrid D-PCM is distinguished as compared with DPCM by effective perturbation reduction, in addition to which a pulse can be saved in the transmitted code groups.

10 Claims, 18 Drawing Figures

TRANSMISSION SYSTEM BY MEANS OF TIME QUANTIZATION AND TRIVALENT AMPLITUDE QUANTIZATION

The invention relates to a transmission system with a transmitter and a receiver for signal transmission by means of discrete output values which characterize the transmitted signals in time quantization and an at least trivalent amplitude quantization as well as to transmitters and receivers used therewith, in particular pulse group code modulation but also discrete amplitude modulation, discrete phase modulation and such like. Herein the transmitter comprises a difference producer whose output signal characterizes the difference of the transmitter input signal and a prediction of the transmitter input signal and comprises a non-linear network coupled to the output of the difference producer for signal compression of the difference signal, said compressed difference signal being transmitted by the discrete output values to the receiver through a transmission path. Said receiver comprising a non-linear network for expanding the received compressed difference signal and comprising a reconstruction arrangement which comprises a storage device for producing the signal to be transmitted. The transmission system according to the invention can advantageously be used for picture signal transmission.

Such a transmission system for the transmission of analog signals in digital format and which are provided with a difference producer are distinguished from other types of digital signal transmission systems in that, owing to the redundancy reduction the quantizing noise is considerably decreased, especially for the lower signal frequencies, so that at a constant reproduction quality it is possible to realize a considerable reduction in the information space in the discrete output values, transmitted through the transmission path, for example with pulse group code modulation the number of pulses per code group.

To realize an optimum reproduction quality it is advantageous to increase in the receiver the storage time of the reproduction arrangement as high as possible for the recovery of the signal values, on the other hand, however, it appears that the noise effect in the signal to be reproduced is increased due to transmission errors, as the influence thereof is maintained for a long time owing to the very long storage time. For this reason, in known receivers in transmission systems of the type indicated reconstruction devices are used which have a reduced storage time, for example by using a leakage circuit which, however, as stated above results in a decrease in the reproduction quality, in particular an unfavourable effect on the display of the contour in picture transmission. To reduce this influence of transmission faults, another solution has also already been indicated for a receiver without reduction of the storage time in the reconstruction device, which consists in the use of a fault detector and a delay device, in which each time, in the case of a transmission fault perturbed image lines are replaced by preceding unperturbed image lines in the manner already explained in U.S. Pat. No. 3,825,680.

It is an object of the present invention to provide a transmission system of the type indicated in the preamble which, while simple in construction distinguished itself by a substantially optimum reproduction quality, in which the perturbations caused by transmission faults are reduced to a slightly- or non-disturbing magnitude within the very short time of only a few successive discrete output values.

The transmission system according to the invention is characterized in that the transmitter is provided with a combination device for combining the output signal derived from the cascade of the difference producer and the non-linear network and in the same transmission form an auxiliary signal derived from an auxiliary circuit, which auxiliary signal is derived from a characteristic signal value which precedes the instant of the transmitter input signal, the output signal obtained by combining the combination device being transmitted in the form of composite discrete output values through the transmission path, whilst the receiver in the cascade of the non-linear network and the reconstruction device includes a separating device which is connected to an output of the reconstruction device and to the input of which separating device the received composite signal is applied on the one hand and, in the same transmission form an auxiliary signal locally derived from the reconstruction device on the other hand, whilst in the separating device the received composite signal is applied to the reconstruction device through the non-linear network whilst the auxiliary signal derived from the reconstruction device is separated.

With the indicated advantages of simplicity of construction, optimum reproduction quality and effective perturbation reduction it appears that in a favourable embodiment, by the addition of an auxiliary signal of a suitable information space compared with that of the non-linear difference signal the highly surprising additional effect is realized that the information space in the transmission path is halved, for example in the case of pulse groups code modulation the saving of 1 pulse per code group.

The invention and its advantages will now be further explained with reference to the Figures.

Figure 3:
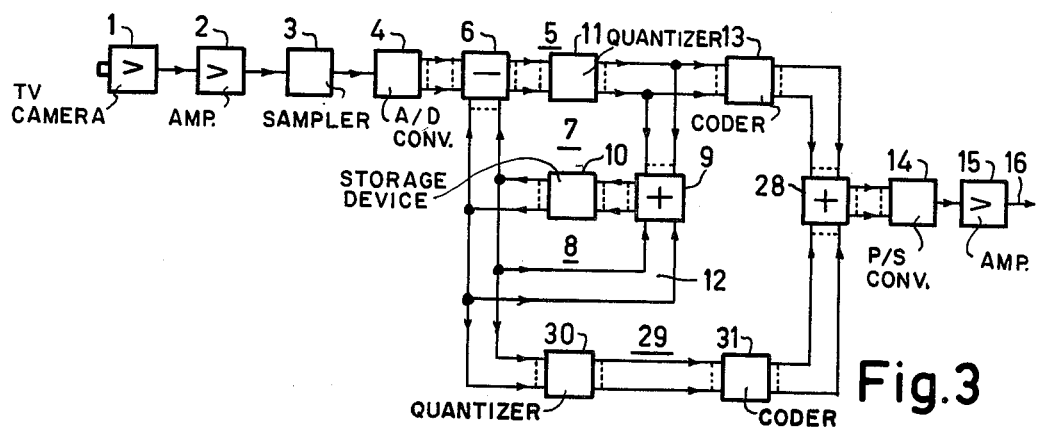
FIG. 3 and FIG. 4 show respectively a transmitter and a receiver according to the invention also arranged for television transmission by means of differential pulse group code modulation.
Figure 4:
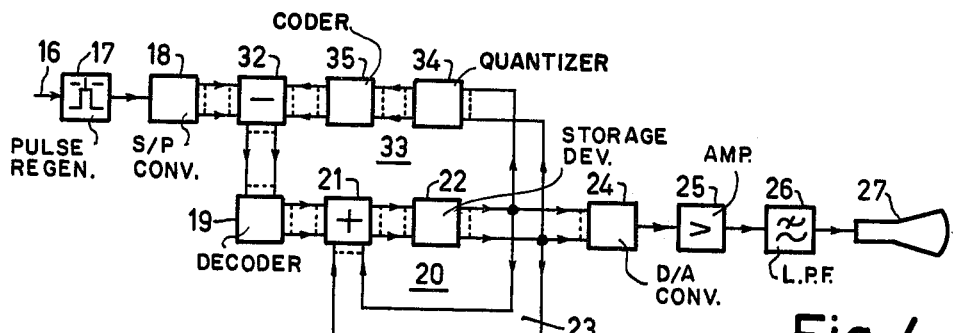
Figure 7:
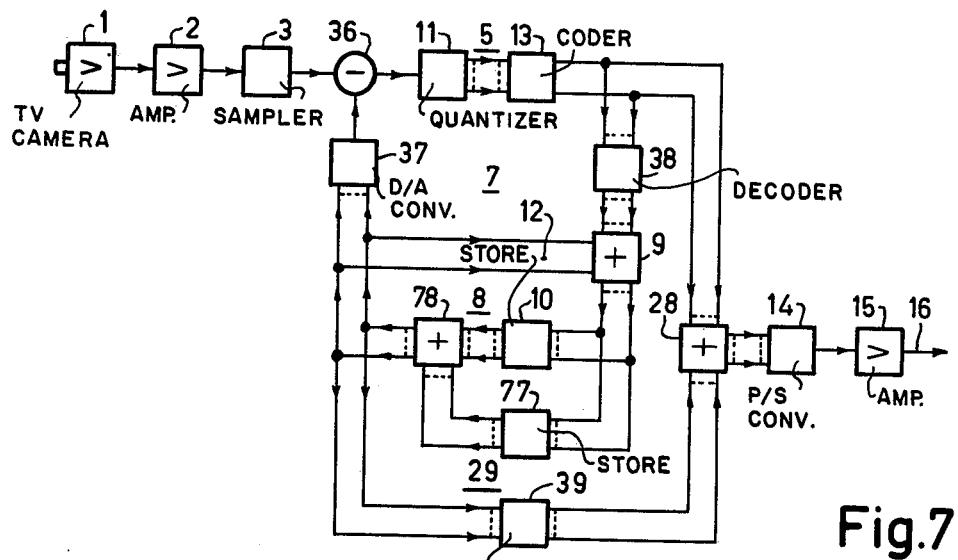
Figure 8:
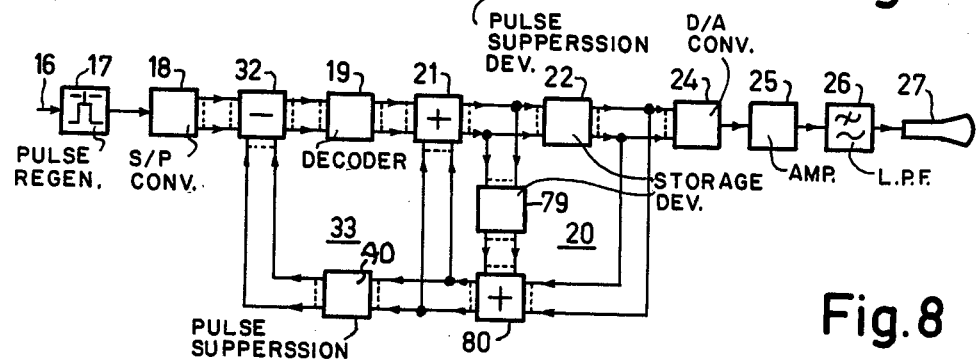
Figure 9:
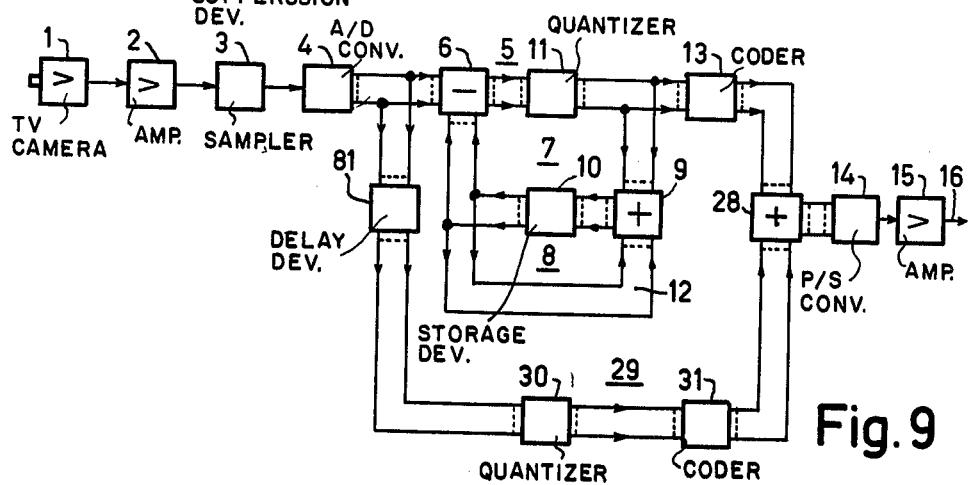
Figure 10:
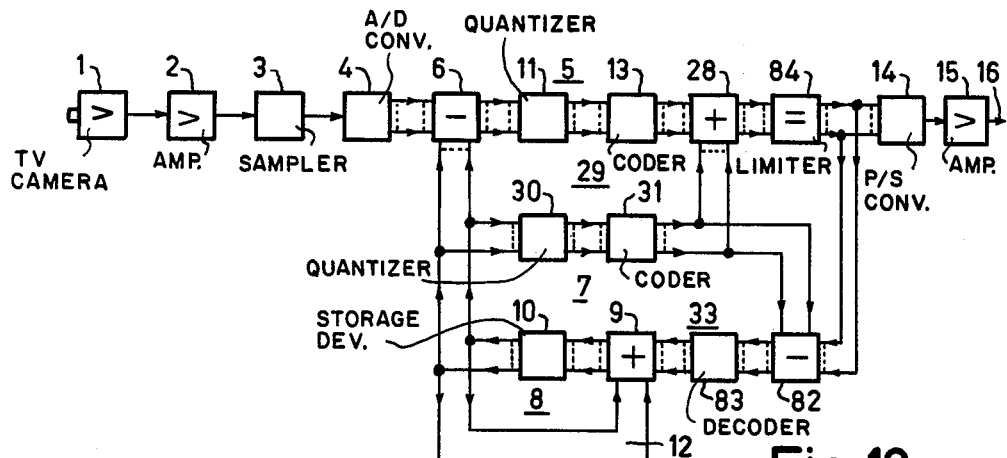
Figure 13:
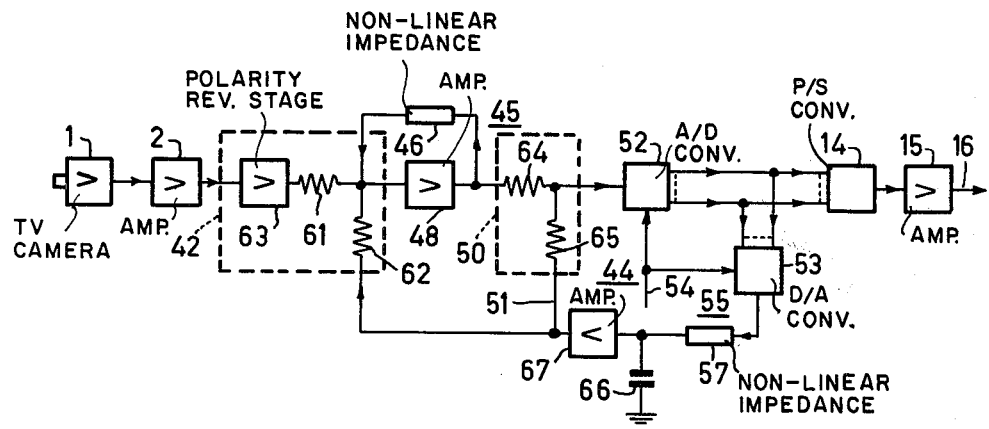
Figure 14:
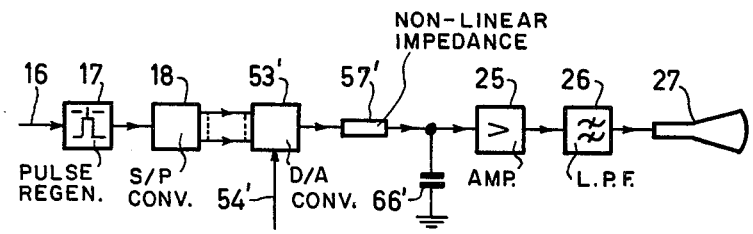
Figure 15:
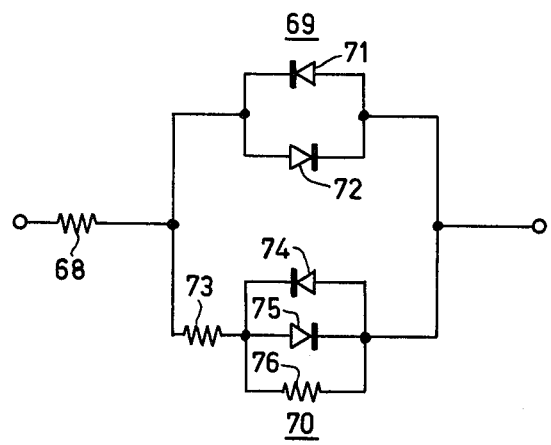

FIGS. 5a—5c and 6a and 6b show characteristics and time diagrams to explain the operaion of the invention;

FIG. 7 and FIG. 8 show respectively a variant of the transmitter and the receiver according to the invention shown in FIG. 3 and FIG. 4 whilst in FIG. 9 and FIG. 10 the variants of the transmitter according to the invention shown in FIG. 3 are illustrated, FIG. 11 – FIG. 14 show further embodiments of the transmitter and the receiver according to the invention shown in FIG. 3 and FIG. 4 whilst FIG. 15 shows in detail an element used in the transmitters and receivers of the type indicated in FIG. 11 – FIG. 14.

Figure 1:
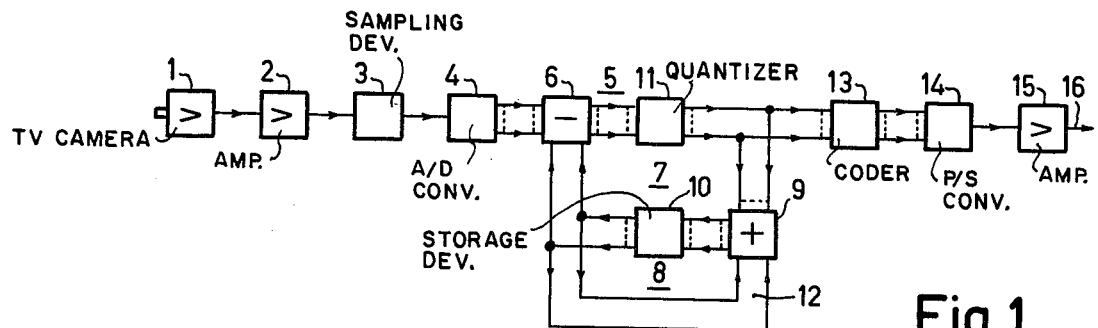
FIG. 1 and FIG. 2 show respectively a known transmitter and a known receiver for television transmission by means of discrete output values in the form of differential pulse group code modulation.

The transmitter for signal transmission by means of discrete output values, shown in FIG. 1 which values characterize in time quantization and at least trivalent amplitude quantization the signals transmitted is arranged for transmission of television signals having a band width of, for example, 5 MHz by means of differential pulse code modulation, in which the unipolar television signals which originate from a television camera 1 and which, for example, have a positive polarity are applied after amplification in a video amplifier 2 through a sampling device 3 to an analog-to-digital converter 4 with parallel pulse outputs, as shown diagrammatically in the Figure. In the rhythm of the sampling frequency of, for example, 10 MHz digital signal values are derived from the analog-to-digital converter 4 in the form of code groups composed of 8 pulses, which code groups are applied to a digital differential pulse code modulator 5 for further processing.

Like the analog-to-digital converter 4 the differential pulse code modulator 5 is constructed in a digital parallel form, comprising a differential signal shaper 6 and a comparison circuit 7 which includes a reconstruction device in the form of a digital integrator 8 provided with a combination device 9 whose output comprises a peak limiter to prevent overloading and a subsequent storage device 10 which is controlled by control pulses of sampling frequency and which has a delay time of one sampling period. The signal shaper 6 is connected to the combination device 9 of the digital integrator 8 through a quantizing stage 11 which reduces the number of quantizing levels in a non-linear scale. The output of the integrator, which is constituted by the storage device 10, is connected through a feedback circuit 12 to an output of combination device 9 and also to an input of the signal shaper 6.

Simultaneously with the transmitter input signal in the form of a code group of the analog-to-digital converter 4 the code group of the digital integrator 8 then occurring is applied in the rhythm of the sampling frequency to the signal shaper 6 as the expected signal value for constituting the digital difference in magnitude and polarity, for example, by using a polarity pulse. For further processing the number of quantizing levels of the differential code groups thus obtained are reduced in the quantizing stage 11 by non-linear quantizing scale. On the other hand the differential code groups derived from the quantizing stage 11 are applied, after magnitude reduction of the code groups in a coder 13 in accordance with the reduced number of quantizing levels of the quantizing stage 11, as discrete output values to an output conductor 16 through a parallel-to-series convertor 14 and an output amplifier 15, whilst on the other hand said differential code groups are offered for integration to the combination device 9 which each time combines said differential code groups with the digital contents then occurring of the storage device 10.

In the loop of the differential pulse code modulator 5, the expected digital signal value at the output of the digital integrator 8 follows the digital signal value of the positive television signal at the output of the analog-to-digital convertor 4. For example, if the digital signal value at the output of the analog-to-digital-converter 4 increases at a given sampling instant $T_p$ with respect to the digital signal value then occurring at the output of the integrator 8, then a positive difference signal will be formed in the signal shaper 6 which signal will cause the positive digital signal value at the output of the integrator 8 to increase whilst inversely when the digital signal value at the output of the analog-to-digital converter 4 decreases at a given sampling instant $T_q$ a negative difference signal will be formed in the signal shaper 6 which will result in a decrease of the positive digital signal values at the output of the integrator 8. More particularly, in the comparison circuit 7 the digital signal value at the output of the integrator 8 in the form of a code group with 8 pulses, for shortness indicated by 8-pulse code groups hereinafter, constitutes a characteristic signal value for a positive television signal at the preceding sampling instant.

Depending on the relative magnitude of the positive digital signal values at the outputs of the analog-to-digital converter 4 and the integrator 8 positive or negative digital signal values in the form of 8-pulse code groups are produced at the output of the signal shaper 6 together with an additional polarity puse intended for polarity indication, which pulse code groups, after reduction of the quantizing levels in the quantizing device stage 11 and a subsequent magnitude reduction of the code groups in the coder 13 are applied as discrete output values to the output amplifier 15 together with a polarity pulse for the transmission through output conductor 16 via the parallel-to-series converter 14. For example, in the construction shown the $2^8$ linear quantization levels having a quantization step-size E associated with the positive and the negative signal values of the signal shaper 6 are reduced in the quantizaion rounding to the most adjacent value at $2^4$ quantizing levels, the 8-pulse code groups with $2^4$ quantizing levels being reduced in the coder 13 to code groups of 4 pulses. Both the quantizing stage 11 and the coder 13 are known in various constructions, for example, in a simple digital construction these elements are constituted by diode matrices (Read Only Memories).

Figure 5A:
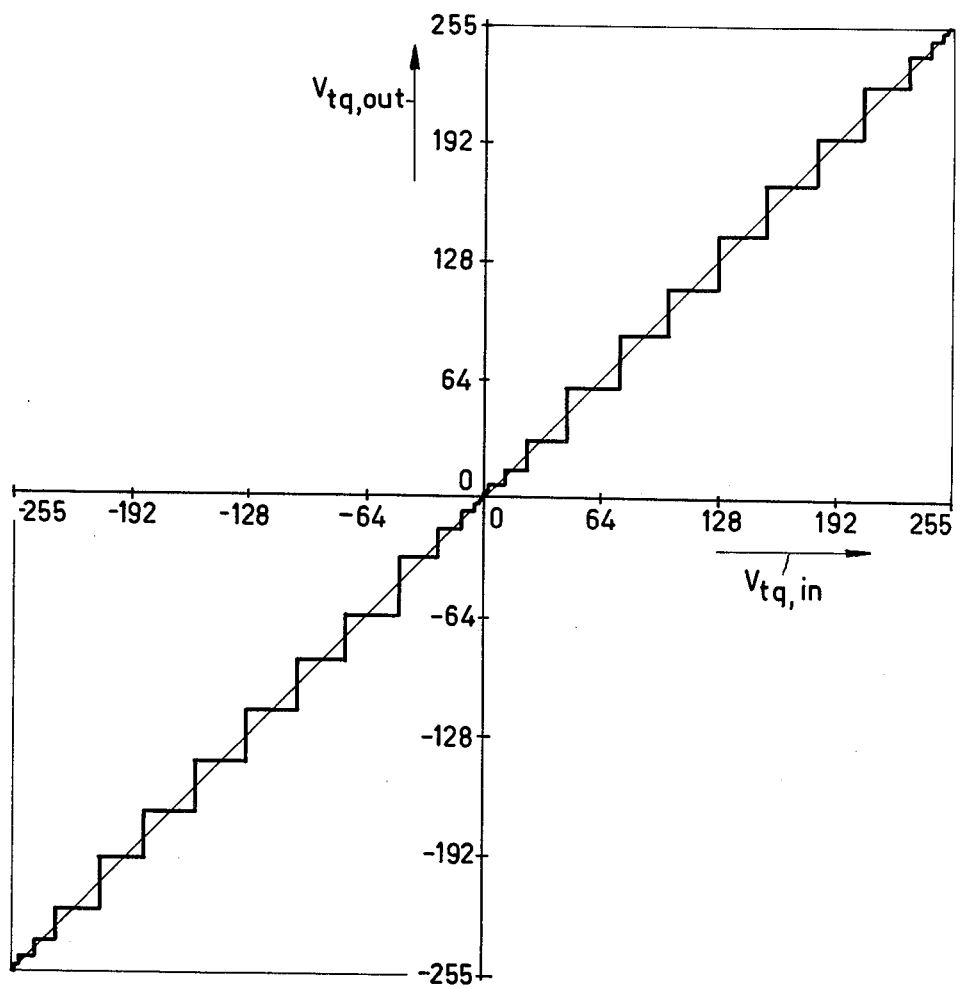
Figure 5:
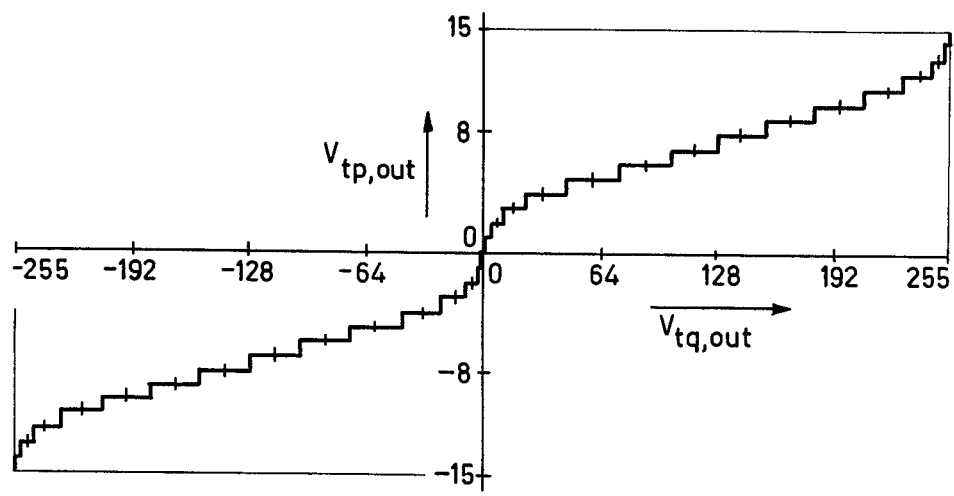
Figure 5:
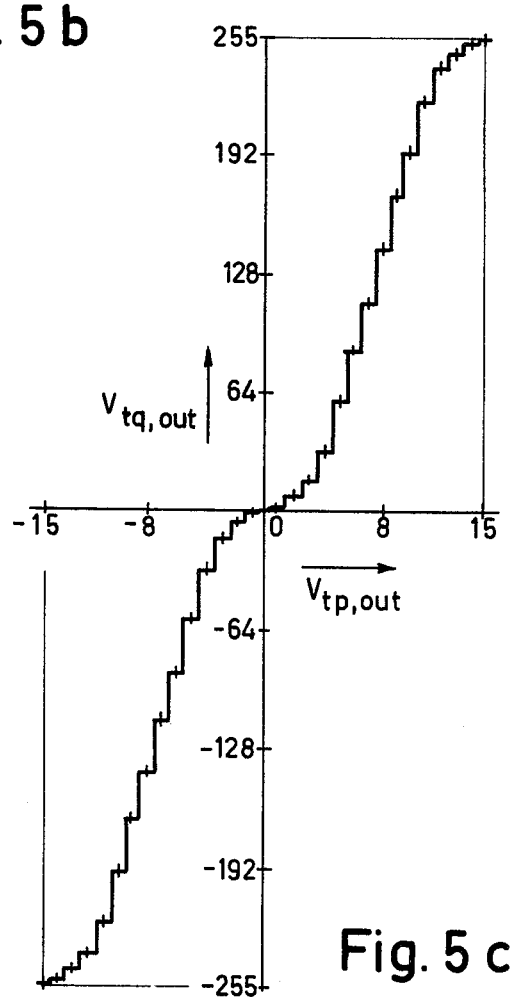

To illustrates the foregoing FIG. 5a and FIG. 5b show some characteristics, in particular, in FIG. 5a the input signal of $2^8$ linear quantizing levels having a step-size $E(V_{tq,in})$ of the quantizing stage 11 is plotted in a quantizing characteristic against the output signal of $2^4$ quantizing levels ($V_{tq,out}$) and in FIG. 5b the latter $2^4$ quantizing levels ($V_{tq,out}$) are plotted as input signal in a coding characteristic against the decimal number value of the four pulse code groups ($V_{tp,out}$). Whilst thus at the output of the quantizing stage 11 the value of the 8-pulse code groups characterize the $2^4$ quantizing levels ($V_{tq,out}$) in a linear manner, there is, as shown by FIG. 5b between the value of the 4-pulse code groups at the output of the coder 13 ($V_{tp,out}$) and the $2^4$ quantizing levels ($V_{tq,out}$) a non-linear relation of signal compression character, which is realized by a fine characterization of the small signal values by means of a fine quantization distribution.

For convenience the below Table I shows the most important data of the quantizing stage 11 and the coder 13, in particular column I shows the number of the $2^4$ quantizing levels, column 2 the magnitude of these quantizing levels expressed in the quantizing step size E ($V_{tq,out}$), column 3 the corresponding 8-pulse code groups at the output of the quantizing stage 11 and column 4 the 4-pulse code groups at the output of the coder 13,

TABLE I

| Number | Quantizing level | pulse code group | pulse code group |
|---|---|---|---|
| 0 | 0E | 00000000 | 0000 |
| 1 | 2E | 00000001 | 0001 |
| 2 | 7E | 00000111 | 0010 |
| 3 | 16E | 00010000 | 0011 |
| 4 | 33E | 00100001 | 0100 |
| 5 | 60E | 00111100 | 0101 |
| 6 | 87E | 01010111 | 0110 |
| 7 | 114E | 01110010 | 0111 |
| 8 | 141E | 10001101 | 1000 |
| 9 | 168E | 10101000 | 1001 |
| 10 | 195E | 11000011 | 1010 |
| 11 | 222E | 11011110 | 1011 |
| 12 | 239E | 11101111 | 1100 |
| 13 | 248E | 11111000 | 1101 |

TABLE I-continued

| Number | Quantizing level | pulse code group | pulse code group |
|---|---|---|---|
| 14 | 253E | 11111110 | 1110 |
| 15 | 255E | 11111111 | 1111 |

For completeness it should be noted that for the transmission through the output conductor 16 together with the four-pulse code groups thus obtained another synchronization signal can also be transmitted in known manner with the associated polarity pulse, whilst the elements, 3, 4, 6, 9, 11, 13, 14 of the differential pulse code modulation transmitter may be controlled by control pulses derived from a central control pulse generator not shown in the Figure.

Figure 2:
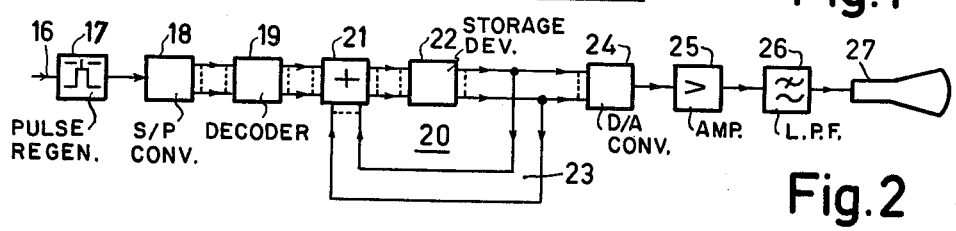

FIG. 2 shows a receiver associated with the transmitter according to FIG. 1 which receiver is also constructed in digital form of the parallel type, for which purpose the four pulse code groups together with the polarity pulse which are entered through conductor 16 are applied to a series-to-parallel converter 18 after pulse regeneration in a pulse regenerator 17.

For recovering the transmitted television signals a decoder 19 is connected to the series-to-parallel converter 18, which decoder converts the 4-pulse code groups and associated polarity pulse in a non-linear manner into 8-pulse code groups with polarity pulse and subsequent to the decoder 19 a reconstruction device is included in the form of a digital integrator 20 which has the same construction as the digital integrator 8 at the transmitter side, comprising a combination device 21 whose output includes a peak limiter, a storage device 22 controlled by control pulses of sampling frequency and a feedback circuit 23. After digital-to-analog conversion in a digital-to-analog convertor 24 and amplification in a video amplifier 25 the recovered analog television signals are applied to a television display tube 27 via a low pass filter 26 which passes the required television signals and suppresses the superjacent frequencies.

By way of illustration, of the decoder for the positive and negative signal values the decimal number value $V_{tp,out}$ of the 4-pulse code groups is plotted in FIG. 5c against the $2^4$ quantizing levels $(t_{tq,out})$ characterized by these code groups in a decoding curve, which, for the purpose of signal expansion shows exactly the inverse variation with respect to the coding characteristic in FIG. 5b of the coder 13 at the transmitter end. In the rhythm of the sampling frequency, the same 8-pulse code groups with polarity pulse are offered to the integrator 20 as to the integrator 8 at the transmitter end and thus the same digital television signal is constructed in the integrator 20, which signal is applied in analog to the display tube 27 through the video amplifier 25 and the low pass filter 26 after digital-to-analog conversion in the digital-to-analog convertor 24.

For completeness it should be noted here that the elements 17, 18, 19, 21, 24 may be controlled by control pulses derived from a control pulse generator, not shown in the Figure, which is synchronized in known manner, for example by the synchronization signal transmitted with it.

To illustrate in a time diagram the signal transmission by means of the indicated differential pulse code modulation system the below table II shows for a period of 16 sampling instants $T_0, T_1 \ldots T_{15}$ the received differential code groups $Q_0, Q_1 \ldots Q_{15}$, the first pulse of which represents as polarity pulse the polarity, for example for an "1" pulse a positive polarity as well as the value "0" and for an "0" pulse a negative polarity whilst the last four pulses indicate the magnitude of the difference values which are indicated in column 2 of table I, expressed in the quantization step size E. Then the difference values shown in column 3 of the below table II are assigned to the code groups $Q_0, Q_1 \ldots Q_{15}$ according to polarity and magnitude.

TABLE II

| sampling instant | code group Q | difference value | output signal |
|---|---|---|---|
| $T_0$ | 10010 | +7 | 45 |
| $T_1$ | 11010 | +195 | 52 |
| $T_2$ | 10000 | +0 | 247 |
| $T_3$ | 10010 | +7 | 247 |
| $T_4$ | 00110 | −87 | 254 |
| $T_5$ | 00110 | −87 | 167 |
| $T_6$ | 00010 | −7 | 80 |
| $T_7$ | 10001 | +2 | 73 |
| $T_8$ | 00001 | −2 | 75 |
| $T_9$ | 00100 | −33 | 73 |
| $T_{10}$ | 00100 | −33 | 40 |
| $T_{11}$ | 10010 | +7 | 7 |
| $T_{12}$ | 10000 | +0 | 14 |
| $T_{13}$ | 10101 | +60 | 14 |
| $T_{14}$ | 10011 | +16 | 74 |
| $T_{15}$ | 10000 | +0 | 90 |

Figure 6:
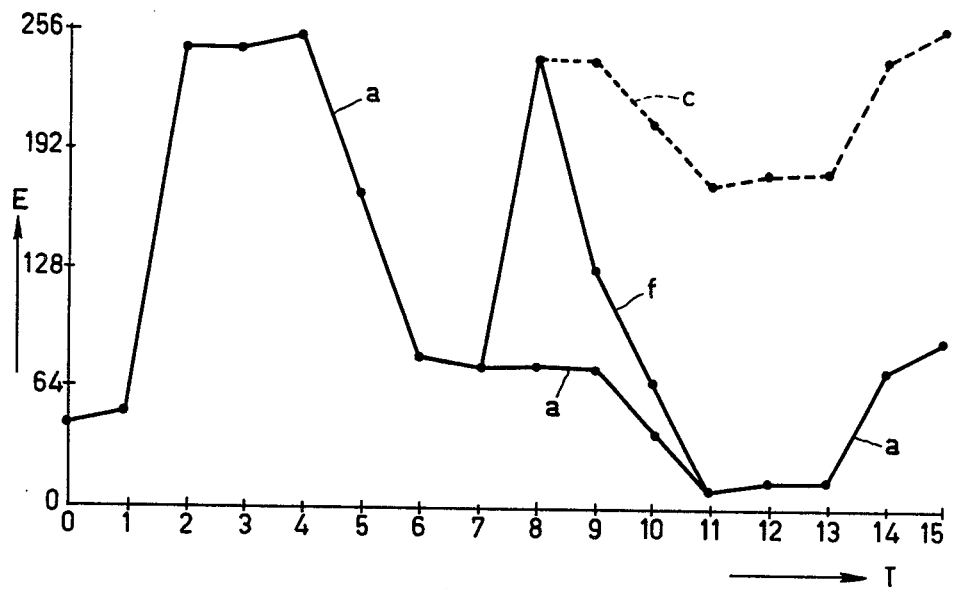
Figure 6:
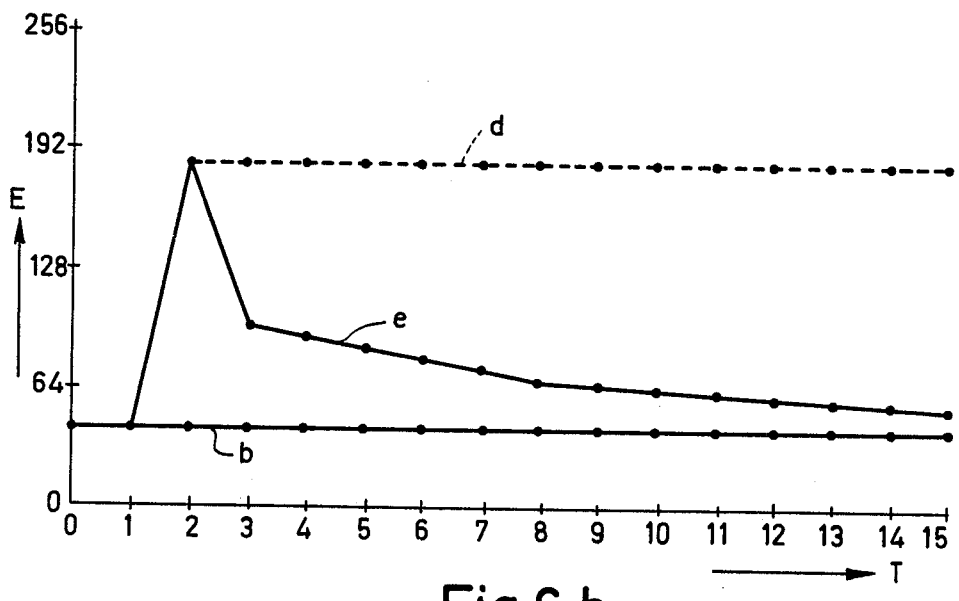

Starting from an initial signal of 45E at the starting instant $T_0$ the curve a in the time diagram of FIG. 6a represents the variation of the television signal belonging to table II during the 16 sampling instants at the output of the integrator 20 expressed in the quantization step-size E, which television signal varies in this period over the entire signal range. For completeness column 4 of the table shows the said integrator output signal in the quantization step-size E.

Starting from the same initial signal the time diagram in FIG. 6b also illustrates by means of b a constant television signal which in the sampling instants $T_0$-$T_{15}$ is each time characterized by code groups 10000. As a result of the digital integrators with ideal integrator operation used, the constant television signal b is depicted in an ideal manner without its quality being affected by leakage currents.

In practice the differential pulse code modulation system described so far having signal compression at the transmitter and signal expansion at the receiver end yields, owing to its low quantizing noise especially to the lower signal frequencies have the advantage of the reduced size of the code groups whilst retaining an excellent reproduction quality, however, the integrator used for recovering the transmitted signal renders the described transmission system particularly sensitive to transmission errors. For example, if during the transmission of the signal a in the time diagram in FIG. 6a at the sampling instant $T_8$ the code group 11001 is received instead of the desired code group 10001, which corresponds to a deviation from the difference value of 168E − 2E = 166E, then during the further duration of the signal a, owing to the integrator operation a perturbation will remain, whose variation is indicated by the dotted curve c. Also in the time diagram in FIG. 6b the influence of a transmission fault is illustrated by the dotted line d, if at the sampling instant $T_2$ the code group 11000 is received instead of the desired code group 10000 which results in a deviation from the difference value of 141E − OE ± 141E.

With the above-mentioned transmission-technical advantages of differential pulse code modulation at a particular simple construction, in accordance with the invention whilst using a new concept the disturbing influence of transmission errors are reduced to a slightly- or non-disturbing magnitude within the very short period of only a few successive sampling instants, by using the transmitter and receiver according to the invention shown in FIG. 3 and FIG. 4 respectively. Elements which correspond with FIG. 1 and FIG. 2 are given the same reference numerals.

In accordance with the invention the transmitter in FIG. 3 therefore comprises a combination device 28 to combine the output signal derived from the cascade of the differential signal shaper 6 and the non-linear network 11, 13 and an auxiliary signal derived in the same transmission form from an auxiliary circuit 29, which auxiliary signal is derived from a characteristic signal value which precedes the instant of the transmitter input signal, whilst the output signal obtained in the form of the composite code groups by combining in the combination device 28 is transmitted as composite discrete output values through the transmission path 16.

In the indicated embodiment the television signal of positive polarity in the form of 8-pulse code groups which is produced at the output of the integrator 8 is used as input signal of the auxiliary circuit 29, which pulse code groups after quantizing in a quantizing stage 30 into $2^4$ quantizing levels and coding into 4-pulse code groups in a coder 31 are combined as discrete output values for the transmission through the output conductor 16, with the differential code groups of the differential pulse code modulator 5 in the combination device 28. For simplicity the quantizing stage 30 and the coder 31 in the auxiliary circuit 29 and the quantizing stage 11 and the coder 13 of the differential pulse code modulator 5 are mutually equal in this embodiment, whilst the most important data of the quantizing stage 30 and of the coder 31 are specified in table I and the variation of the quantizing characteristic and of the coding characteristic respectively are illustrated in FIG. 5a and FIG. 5b.

Each time the digital difference signal of positive or negative polarity derived from the differential pulse code modulator 5 in the form of a 4-pulse code group with additional polarity pulse is produced the digital signal of positive polarity supplies at the output of the integrator 8 through the quantizing stage 30 and the coder 31 precisely the auxiliary signal in the form of a 4-pulse code group, whilst after the two code groups are combined in the combination device 28 the composite code group for transmission through the output conductor 16 is obtained. The composition of the composite code groups will now be determined for the signal $a$, indicated in Table II and illustrated in the time diagram in FIG. 6a.

Starting from the sampling instant $T_0$ (cp. Table II) the differential pulse code modulator 5 supplies as discrete output value the differential code group $Q_0$ having as first pulse the polarity pulse and the value to be expected of the transmitter input signal of 45E occurs at the integrator 8, which via the quantizing stage 30 and the coder 31 in accordance with the Table I results in the code group $S_0$ as the auxiliary signal, whose polarity can at all times be designated by a "1" pulse, as with the integrator output signal the auxiliary signal invariably shows a positive polarity. Combining the two code groups $Q_0$ and $S_0$ in the combination device 28 results in the composite code group 10110.

In exactly the same manner the composite code group is derived at the sampling instant $T_1$, in particular, as appears from Table II the differential code group amounts at this instant to $Q_1$ and by adding the difference values belonging to the sampling instant $T_O$ (cp. table II) the output signal of 52E is produced at the integrator 8, which via the quantizing stage 30 and the coder 31 in accordance with table I results in the code group 10101 as auxiliary signal $S_1$. Combining the two code groups $Q_1$ and $S_1$ in the combination device 28 again results in the composite code group.

When the procedure is continued in this way, over the 16 sampling instants $T_0$, $T_2$ ... $T_{15}$, the composite pulse groups are derived in the below table III from the signal $a$ which varies over the entire signal range, where column I shows the sampling instants $T_k$, column 2 the differential code groups $Q_k$, column 3 the digital output signal of the integrator 8 expressed in the quantizing step size E and the 8-pulse code groups, column 4 the digital auxiliary signal $S_k$ and column 5 the composite code group.

TABLE III

| Sampling instant $T_k$ | Differential code group $Q_k$ | Output signal integrator 8 | Auxiliary signal $S_k$ | Composite code group | transmitted composite code group $P_k$ |
|---|---|---|---|---|---|
| $T_0$ | 10010 | 45E 00101101 | 10100 | 10110 | 0110 |
| $T_1$ | 11010 | 52E 00110100 | 10101 | 11111 | 1111 |
| $T_2$ | 10000 | 247E 11110111 | 11101 | 11101 | 1101 |
| $T_3$ | 10010 | 247E 11110111 | 11101 | 11111 | 1111 |
| $T_4$ | 00110 | 254E 11111110 | 11111 | 11001 | 1001 |
| $T_5$ | 00110 | 167E 10100111 | 11001 | 10011 | 0011 |
| $T_6$ | 00010 | 80E 01010000 | 10100 | 10100 | 0100 |
| $T_7$ | 10001 | 73E 01001001 | 10110 | 10111 | 0111 |
| $T_8$ | 00001 | 75E 01001011 | 10110 | 10101 | 0101 |
| $T_9$ | 00100 | 73E 01001001 | 10110 | 10010 | 0010 |
| $T_{10}$ | 00100 | 40E 00101000 | 10100 | 10000 | 0000 |
| $T_{11}$ | 10010 | 7E 00000111 | 10010 | 10100 | 0100 |
| $T_{12}$ | 10000 | 14E 00001110 | 10011 | 100111 | 0011 |
| $T_{13}$ | 10101 | 14E 00001110 | 10011 | 10111 | 0111 |
| $T_{14}$ | 10011 | 74E 01001010 | 10110 | 11001 | 1001 |
| $T_{15}$ | 10000 | 90E 01011010 | 10110 | 11001 | 1001 |

For the transmission of the constant auxiliary signal $b$ in FIG. 6b the constant integrator signal of 45E supplies via the quantizing stage 30 and the coder 31 the code group 10100 as auxiliary signal which by combining it with the differential code 10000 of the differential pulse code modulator 5 gives the composite code group 10100 at the output of the combination device 28 during the entire duration of the constant television signal.

A study of the composite code groups in column 5 of table III reveals that by combining the differential code groups $Q_k$ of positive or negative polarity and the auxiliary signal code groups $S_k$ of exclusively positive polarity the first pulse of the composite code groups which is used as polarity pulse is invariably constituted by an "1" pulse over the entire signal range. By combining the differential code groups $Q_k$ with the auxiliary signal code groups $S_k$ of half the information space (exclusively positive polarity) the transmission of the first pulse of each of the composite code groups can be dispensed with for the signal transmission through the output conductor 16 without loss of information, so that for the signal $a$ which varies over the entire signal range the code groups $P_k$ shown in column 6 are transmitted as composite code groups in the duration of the sampling instants $T_0, T_2 \ldots T_{15}$ and in this period of time the constant code group $P_1 = 0100$ for the constant signal $b$.

This saving in pulses in the transmitted code groups $P_k$ is the more surprising as these 4-pulse code groups $P_k$ comprise without polarity pulse additional information which renders it possible to reduce at the receiver side the perturbations illustrated by $c$ and $d$ in FIG. 6a and FIG. 6b and which are the result of transmission errors, to a slightly- or non-disturbing magnitude in the very short period of only a few successive sampling instants.

In accordance with the receiver according to the invention shown in FIG. 4 the cascade of the non-linear network in the form of the decoder 19 and the construction device 20, which is constructed as an integrator, includes a separating device 32 connected to an output of the reconstruction device 20 to the input of which separating device there is applied on the one hand the entered composite signal and on the other hand in the same transmission form a local auxiliary signal derived from the reconstruction device 20, whilst in the separating device 32 the entered composite signal is applied to the reconstruction device 20 via the non-linear network 19 whilst the local auxiliary signal derived from the reconstruction device 20 is separated.

In the above-mentioned arrangement the separating device 32 is constructed as a combination device in the form of a subtractor stage whose outputs are connected respectively to the output of the series-to-parallel convertor 18 and to the output of an auxiliary circuit 33 connected to the output of the integrator 20 which auxiliary circuit comprises the cascade circuit of a quantizing stage 34 and a coder 35, which quantizing stage 34 and coder 25 are constructed in exactly the same manner as those in the auxiliary circuit 29 of the transmitter.

In the receiver described, in the absence of transmission errors, the same digital output signal is constructed in integrator 20 as in the integrator 8 at the transmitter end, namely, each time on receipt of a composite code group, precisely the associated auxiliary signal is locally produced in the auxiliary circuit 33 which is of the same construction as the auxiliary circuit 29 at the transmitter end, whilst by subtraction in the subtractor device 32 the differential code groups of differential pulse code modulator 5 are recovered which, though the coder 19, attend to the mutual tracking of the digital output signals of the integrators 20 and 8 at the receiver and transmitting end. For example, at the transmission of signal $a$ in FIG. 6a, characterized by discrete output values in the form of the composite pulse groups $P_k$ in column 6 of table III the associated auxiliary signal $S_k$ in column 4 is produced in the auxiliary circuit 33 whereafter by means of subtraction in the subtractor device 32 the differential code groups $Q_k$ in column II are recovered, whilst with the transmission of the constant signal $b$ in FIG. 6b, characterized by the constant code groups the auxiliary signal at the output of the auxiliary circuit 33 is given during the sampling instants $T_0-T_{15}$ by the constant code groups 10100 and the differential code groups associated with the constant signal $b$ by 10000.

After digital-to-analog conversion in the digital-to-analog convertor 24 of the integrator output signal obtained by integration of the differential code groups of the differential pulse demodulator the transmitted television signal is displayed in the display tube 27 through the amplifier 25 with the low pass filter 26. Without being influenced in any way by the auxiliary signal information in the composite code groups the display tube 27 has an optimum reproduction quality of differential signal transmission with signal compression at the transmitter end and signal expansion at the receiver end.

The arrangement described tends to make the auxiliary signal in the composite code groups at the output of the subtraction device 32 equal to zero, particularly if a deviation from the required value occurs at a given receiving instant owing to a transmission error in the output signal of the integrator 20, then the output signal of the auxiliary circuit 33 experiences a corresponding deviation which, at the next receiving instant is applied with opposite polarity to the integrator 20 through the subtraction device 32 and the decoder 19. In the loop integrator 20, auxiliary circuit 33 back through subtractor stage 32 and decoder 19 to the integrator 20 the cycle described is repeated in the following receiving instants until the specified condition is satisfied again by correction of the integrator output signal.

Quantitatively the specified correction process of the integrator output signal can be fully followed by means of table I, as will now be explained with reference to the constant signal $b$ in FIG. 6b, which, in the absence of transmission errors is characterized by a constant integrator output signal of 45E, constant composite code groups 10100, constant code groups 10100 at the output of the auxiliary circuit 33 and differential code groups 10000 at the output of the subtractor stage 32.

If at the receiving instant $T_2$ (cp. FIG. 6b) a transmission error is produced which causes the code group 1100 to be received instead of the correct code group 0100 then the subtractor stage 32 supplies the code group 11000 with the positive polarity indicated by the "1" pulse as first pulse and by the difference value indicated by the 4 subsequent pulses of the code group corresponding, as appears from table I, to an increase in the integrator output signal by 141E to 186E, which integrator output signal results in an increase in the output signal of the auxiliary circuit 33 given by the code group 11010 as appears from table I.

If in the following receiving instants the composite code groups are again received unperturbed than the subtractor device supplies at the next receiving instant $T_3$ the code group 00110 resulting in a decrease of the integrator output signal by 87E to 99E and which produces a code group 10110 at the output of the auxiliary circuit 33 which causes the integrator output signal to decrease by a further 7E to 92E at instant $T_4$.

When continuing in this way for the following receiving instants the further correction of the integrator output signal is obtained, which, plotted in the time diagram of FIG. 6b shows the variation indicated by the curve $e$. A slight residual deviation may remain, whose maximum magnitude is given by the difference in the two limiting auxiliary signal-quantizing levels of the constant signal $b$.

In exactly the same manner the integrator output signal can be calculated for the transmission error at the instant $T_8$ in the varying signal $a$ in the subsequent sampling instants, which output signal plotted in FIG. 6a shows the variation illustrated by the curve f. Unlike with the constant signal an exact correction of the perturbation by a transmission error is substantially always obtained here, in particular this exact perturbance correction for the signal a occurs already after three sampling instants at the instant $T_{11}$.

Immediately after the occurrence of a transmission error a particularly effective reduction in the perturbance occurs in the arrangement according to the invention within a very short period of time, which reduction reduces the influence of the perturbation to minimum values, as appears from the perturbation reduction curve e and f as compared with the curve c and d in the FIGS. 6a and 6b. This particularly effective reduction in perturbance is clear on the display tube 27, namely the linear perturbance of a transmission error in the display tube 27 (cp. the curves c and d in the FIGS. 6a and 6b) is reduced to a punctiform perturbation when the measures according to the invention are used.

Actually the defined auxiliary information in the composite code groups at the receiver end constitutes at each instant simultaneously criterion and correction function to optimum reproduction quality, in particular, if the auxiliary information at the output of the subtractor stage 32 has the zero value in the case of an unperturbed reception then the optimum reproduction quality of differential transmission with signal compression at the transmitter end and signal expansion at the receiver end is unambiguously laid down in display tube 27. However, if this correct reception is perturbed by, for example, a transmission error, then the auxiliary information effects immediately a correction of the output signal of the integrator 20 in the entered code groups, which reduces within a very short period of time the auxiliary signal information at the output of the substractor stage 32 to the zero value, which, as appears from the foregoing constitutes the unambiguous criterion for the optimum reproduction quality in the display tube 27. If it is borne in mind that this striking advantages of optimum reproduction quality and effective reduction of the perturbation with a simple construction is associated with the fact that a pulse can be dispensed with in the transmitted code groups then a great technical stride forward in the field of signal transmission, particularly of time signals characterized by means of a time function, such as picture signals, telemetry and such like is realized by the invention.

Added to this is the great freedom in the signal compression- and the signal expansion characteristics for the differential transmission as well as in the transfer characteristic of the auxiliary signal transmission, so that new possibilities in the construction of the transmission system according to the invention may be realized.

FIG. 7 and FIG. 8 show further embodiments of a transmitter and a receiver in a transmission system according to the invention which are different from the transmitter and receiver shown in FIG. 3 and FIG. 4 in the differential pulse code demodulator and reproduction device used as well as the construction of the auxiliary circuit 29 and 33 for the transmission of the auxiliary signal. Elements corresponding with FIG. 3 and FIG. 4 are given the same reference numerals.

Compared with the transmitter in FIG. 3 the transmitter in FIG. 7 is partly designed in analog techniques comprising an analog signal shaper 36 which is fed by a transmitter input signal derived from the sampling device 3 and the expected value of the transmitter input signal of digital-to-analog convertor 37 in the comparison circuit 7 of the differential pulse code modulator 5. In the quantizing stage 11 and the coder 13 the analog difference signal obtained in this manner is converted into the differential code groups which are processed in a corresponding manner as in the transmitter in FIG. 3.

To this end the differential code groups are applied on the one hand with signal compression through a decoder 38 to the transmitter construction device 8 which is connected to the digital-to-analog convertor 37 to produce the expected value of the transmitter input signal. The construction shown of the transmitter construction device 8 differs in so far from that in the transmitter in FIG. 3 that besides the storage device which is controlled by control pulses and which has a delay time of a sampling period for producing the expected value of the transmitter input signal a second storage device 77 is used which has a different delay time, for example in the order of magnitude of a line time, the contents of which is combined with that of the storage device 10 in a combination device 78. Optionally still further storage devices may be included in the reconstruction device 8. This to obtain output signals which are mutually delayed over different time distances and which are combined through weighting networks.

On the other hand the differential code groups are combined in the combination device 28 in the same manner as in the transmitter in FIG. 3 with the digital auxiliary signal of the auxiliary circuit 29 connected to the reconstruction device 8 to produce the composite code groups which are transmitted via the parallel-to-series convertor 14 and the amplifier 15 via the output conductor 16, namely again in the form of 4-pulse code groups without polarity pulse.

In exactly the same manner as already explained with reference to FIG. 4 the transmitted television signals are recovered in the receiver in FIG. 8 from the composite code groups which enter via conductor 16, which signals are applied to the display tube 27 for display. As with the receiver in FIG. 4 an auxiliary circuit 33 is connected to an output of the reconstruction device 20 for producing the local auxiliary signal in the form of code groups which are substracted in the subtractor stage 32 from the entered composite code groups, whilst as before the auxiliary signal included in the composite code groups becomes only operative for the quality correction of the transmitted television signal in the case of a perturbed reception. In a manner corresponding with the reconstruction device 8 at the transmitter end the reconstruction device 20 also comprises a second storage device 79 having a delay time of the order of magnitude of a line time, whose contents is combined with the contents of storage device 22 in a combination device 80.

The great freedom in the design of the auxiliary circuits 29, 33 enables a considerable simplification in the assembly of the equipment, in particular, instead of the quantizing stage 30, 34 and the coder 31, 35 in FIG. 3 and FIG. 4 a discrete output value suppression device 39, 40 is used here in the auxiliary circuits 29, 33 for the discrete output value reductor which suppresses the least significant pulses in the code groups of the reconstruction device 8, 20. If, for example, the reconstruction devices 8, 20 are designed for 8-pulse code groups just as in the FIG. 3, 4 then the suppression of 4 or 5 significant pulses in the pulse suppression device 39, 40 supplies as auxiliary signal 4 or 3-pulse code groups, which then characterize the auxiliary signal in a linear quantizing scale with quantizing levels which are positioned at mutually equal distances of 16E or 32E. In practice these pulse suppression devices 39, 40 of the least significant pulses are realized in a particularly simple manner by connecting the output terminals of the 4 most significant pulses in the reconstruction devices 8, 20 directly to the combination device 28 and the separating device 32 via the auxiliary circuits 29, 33. It may be important, especially for adjusting the auxiliary signal with 3-pulse code groups to connect an adjusting signal source to the discrete output value reductor 39, 40 whilst, to save the polarity pulse in the transmitted code groups in dependence on the compression characteristic of the difference signal the information space of the auxiliary signal has been chosen different from that in FIG. 3, in particular ⅛ of that of differential code groups. In practical applications the said information space is therefore situated between ¼ – ⅜ of the information space of the differential code groups.

With the extremely simple construction the noticeable advantages of the transmission system according to the invention are also here fully realized, particularly the saving in the polarity pulse, in the transmission via the output conductor 16, as well as the direct correction of the reproduction quality at a transmission error and, in the absence of transmission errors, the optimum reproduction quality of the differential transmission with signal compression at the transmitter end and signal expansion at the receiver end without being influenced at all by the auxiliary signal of limited reproduction quality. The transmitter according to the invention always offers the possibility to realize a saving in pulses by means of a suitable peak limiter in the circuit of the differential pulse code modulator, for example, in the cascade with the differential signal shaper or by means of a mutual adaptation of the compression characteristic of the differential transmission and the characteristic of the auxiliary signal transmission. On the other hand the possibility exists to make for given applications the relative sizes of the code groups, that is to say the information space for the differential transmission and for the transmission of the auxiliary signal different than in the indicated embodiments. So, for example, for telemetry applications a segment-shaped linear characteristic can be used for the compression characteristic of the differential transmission.

FIG. 9 shows a variant of the transmitter according to the invention which differs from the transmitter shown in FIG. 3 in the construction of the auxiliary circuit 29. In particular the auxiliary signal, which is determined by the signal value which precedes the instant of the transmitter input signal, is not derived from the reconstruction device 8 in the comparison circuit 7 but from the analog-to-digital convertor 4, which for this purpose is connected via a delay device 81, for example in the form of a shift register element having a delay time of one sampling period to the combination device 28 by means of the cascade of quantizing stage 30 and coder 31 to be combined with the differential code groups of the differential pulse code modulator after signal compression of the quantizing stage 11 and coder 13. In the manner as in FIG. 3 the composite code groups formed in this way are supplied to the amplifier 15 via the parallel-to-series convertor 14 for transmission via the conductor 16.

FIG. 10 shows a further variant of the transmitter according to the invention.

Herein, as for the transmitter in FIG. 3 a digital difference of the transmitter input signal derived from the analog-to-digital converter 4 and the signal value to be expected from the reconstruction device 8 is applied in the form of a digital integrator, whilst the digital difference signal is applied via the quantizing stage 11 and the coder 13 as non-linear network to the digital combination device 28 for combining with the auxiliary signal which is derived from the reconstruction device 8 and which is applied, via the quantizing stage 30 and the coder 32 and output values reductor to the combination device 28.

The transmitter shown differs from the previous constructions in that the reconstruction device 8 in the comparison circuit 7 is included in an auxiliary transmitter comprising a subtractor stage 82 and a decoder 83 for digital signal expansion, whilst the transmitted composite code groups are applied to the subtractor stage 82. As with the previous receivers the digital auxiliary signal derived from the auxiliary circuit 33 is subtracted in the subtractor stage 82 from the composite code groups whereafter the differential code groups thus obtained are applied to the reconstruction device via the decoder 83.

The transmitter described shows the important advantage of the substantially full mutual freedom in the choice of signal compression characteristic of the non-linear network 11, 13 and the transfer characteristic of the non-linear network 30, 31 in the auxiliary circuit 29 at the saving of the polarity pulse in the transmitted composite code groups, because in this embodiment a digital limiter 84 can be included without inconvenience after the combination device 28 for the connection of the auxiliary receiver. For in this position the limiter does not influence the reproduction quality as it is included in the loop of the differential pulse code modulator 5 through the auxiliary receiver.

For completeness it should be noted here that for transmitting the auxiliary signal a signal expansion characteristic may in principle also be used instead of a signal compression or linear characteristic.

Within the frame work of the invention still further constructions are possible with the combination of the discrete output values of the differential signal and the auxiliary signal. So, for example, the possibility exists to produce the differential signal by applying the delayed transmitter input signal to the differential signal shaper together with the transmitter input signal as the value to be expected or the differential pulse group code modulator may be constructed in another manner.

The auxiliary signal may also be derived from a separate pulse code modulator, however the construction described in which the auxiliary signal is derived from the reconstruction device in the comparison circuit of the differential pulse code modulator differ from one another by a saving in equipment as well as by its minimum quantization noise.

The transmission system according to the invention can be constructed, as it is also for other manners of transmission with discrete output values instead of pulse group code modulation, for example, discrete amplitude modulation, discrete phase modulation, and such like.

Figure 11:
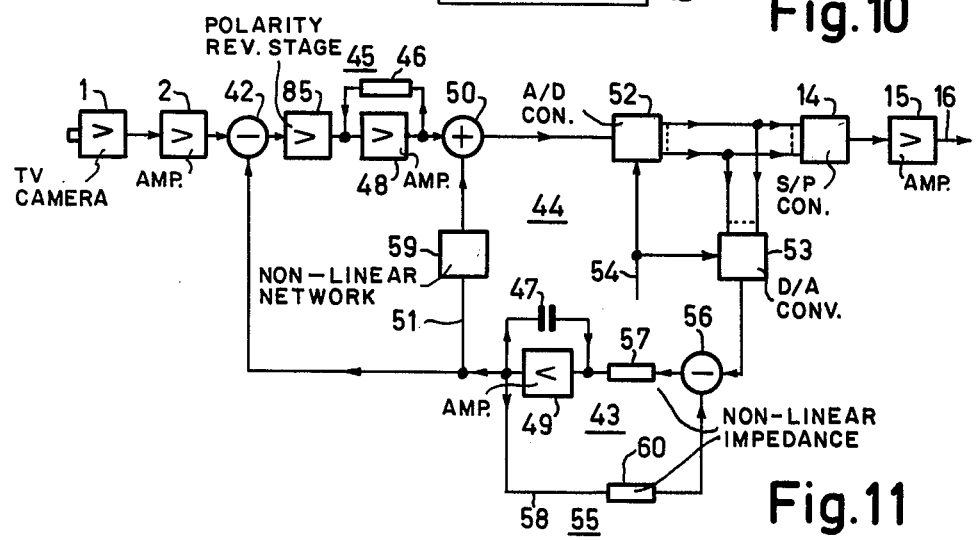
Figure 12:
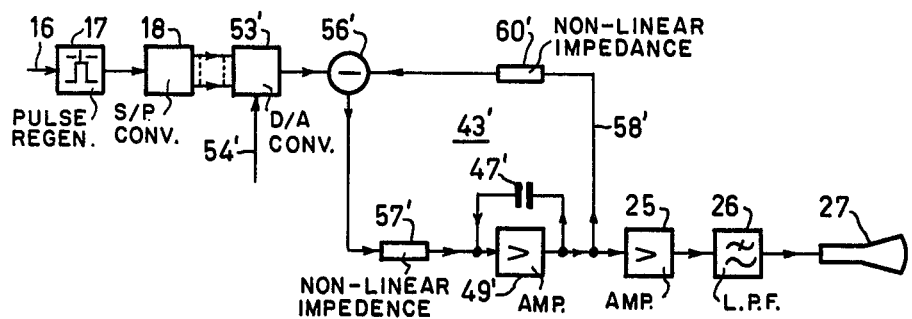

Whilst in the preceding constructions the mutual combination and separation of the differential signal and the auxiliary signal is effected along fully digital lines the mutual combination and separation in the transmission system according to the invention with the transmitter shown in FIG. 11 and the receiver shown in FIG. 12 is effected on an analogue bases.

Just as for the preceding constructions the pulse code modulator transmitter shown in FIG. 11 comprises a differential signal shaper 42 fed by a transmitter input signal derived from a video amplifier 2 and the values to be expected from the transmitter input signal derived from a reconstruction device in the form of an integrator 43 and a comparison circuit 44 as well as a subsequent non-linear network 45 for signal compression, which elements 42, 43, 45, have now, however, been designed for analog signal processing. Both the analog network 45 for signal compression and the integrator 43 may be formed in a different manner, particularly in the embodiment shown by the inclusion of a non-linear impedance 46 and the capacitor 47 in the feedback cirvuit of operational amplifiers 48, 49 whilst a polarity reversing stage 85 is included prior to the non-linear network 45.

After the output signal of the cascade composed of the differential signal shaper 42 and the nonlinear network 45 has been combined in a combination device 50 with the auxiliary signal of the auxiliary circuit 51 connected to the integrator 43 the composite code groups are obtained in an analog-to-digital convertor 52 which constitutes the input of the comparison circuit 44. Both the analog-to-digital converter 52 and the digital-to-analog converter 53 are constructed in parallel form and are controlled in the rhythm of the sampling frequency by control pulses of a control pulse conductor 54 whilst the composite code groups at the output of the analog-to-digital converter 52 are converted, for further processing in the comparison circuit 44, into the corresponding analog signal and for the transmission via the output conductor 16, to the amplifier 15 through the parallel-to-series convertor 14. For example, in the form of 4-pulse code groups without polarity pulse as in the preceding embodiments.

In the indicated pulse code modulation transmitter with analog signal processing an analog auxiliary receiver 55 is included in the reconstruction circuit 44 which auxiliary receiver is designed for the analog signal processing in exactly the same manners as the receivers for digital signals in FIG. 4 and FIG. 8. More particularly, the analog signals of the digital-to-analog convertor 53 are applied to the cascade of a separating device 56 designed as a subtractor stage, a non-linear network 57 for signal expansion in the form of a non-linear impedance included in the signal circuit, this impedance having a transfer characteristic which is inverse to the signal compression characteristic of the non-linear network 45 as well as integrator 43 which is connected to the subtractor stage 56 through an auxiliary circuit 58. After separation of the auxiliary signal in the subtractor stage 56 an analog output signal is thus produced at the integrator 43 of the auxiliary receiver 55, which signal is applied in the manner as in the transmitter in FIG. 3 and FIG. 7 to the differential signal shaper 42 and also through the auxiliary circuit 51 to the combination device 50 for producing the composite code groups which are transmitted via output conductor 16.

Using the measures according to the invention it is possible, with the pulse code modulation transmitter described, with analog signal processing at the receiver end to realize yet an excellent reproduction quality, namely by applying the composite code groups instead of the differential code groups to the auxiliary receiver 55 in the comparison circuit 44 the leakage phenomena produced in the analog integrator 43 are obviated to a very large extent, which otherwise might lead to non-linear distortions.

FIG. 12 shows the receiver which is associated with the transmitter in FIG. 11 and which in its construction corresponds in essence with the indicated auxiliary receiver 55 in the transmitter according to FIG. 11. Corresponding elements are given the same reference numerals which, however, have been provided with an accent for the purpose of distinction.

In the receiver shown the incoming code groups of conductor 16 are applied through the pulse regenerator 17 and the series-to-parallel convertor 18 to a digital-to-analog converter 53' whose analog output signals are processed in the same manner as in the auxiliary receiver 55 at the transmitter end. Just as in the auxiliary receiver 55 the digital-to-analog converter 53' with parallel output is controlled in the rhythm of the sampling frequency by control pulses of the control pulse conductor 54' and the analog output signals obtained from the digital-to-analog converter 53' are applied to the cascades of a separating device 56' in the form of a subtraction stage, a non-linear impedance 57' included in the signal circuit by way of signal expansion network as well as an integrator 43', composed of an operational amplifier 49' having a capacitor 47' comprised in the feedback circuit which capacitor is connected through an auxiliary circuit 58' to the subtraction stage 56'. At the output of the integrator 43' the transmitted television signals are obtained in this manner in analog form, which after amplification in the amplifier 25 are displayed in the display tube 27 through the low pass filter 26.

Whilst avoiding non-linear distortions owing to leakage phenomena in the analogue integrator 43' an optimum reproduction quality is realized in the display tube 27 by using the measures according to the invention, whilst just as for the preceding constructions, when a transmission error occurs, the perturbation caused thereby can be corrected within a very short period of time. All the advantages mentioned in the foregoing are also realized with the indicated pulse code transmission system with analog signal processing. If desired, just as with the transmission system in FIG. 3 and FIG. 4 it is possible to transmit the auxiliary signal with signal compression in the composite code groups for which purpose non-linear networks 59, 60, 60' must be included in the transmitter auxiliary circuit 51 as well as in the transmitter auxiliary circuit 58, 58' of the auxiliary receiver 55 and the associated receiver, which non-linear networks 59, 60, 60' must then have mutually equal signal compression characteristics.

The freedom in the design of the transmission system according to the invention offers the possibility of considerable simplifications in the practical realization especially with linear quantization of the auxiliary signal in the composite code groups, as will now be explained with reference to the transmission system shown in FIG. 13 and FIG. 14. Herein the transmitter in FIG. 13 and the receiver in FIG. 14 are designed as variants of the transmitter and receiver shown in FIG. 11 and FIG. 12, corresponding elements having been given the same reference numerals.

Just as with the transmitter in FIG. 11 and the transmitter in FIG. 13 the output signal of the analog integrator of the auxiliary receiver included in the comparison circuit 44 is applied to the differential signal shaper 42 and the combination device 50, the differential signal shaper being constituted by two resistors 61, 62 with a polarity reversing stage 63 which precedes resistor 61 and the combination device 50 being constituted by two resistors 64, 65. In the practical embodiment the polarity reversing stage is not constructed as a separate unit but included in the video amplifier 2 whilst the resistors 61, 62 are mutually equal which also applies to the resistors 64, 65.

Thus, at the output of the analog-to-digital converter 52 the composite code groups are obtained which on the one hand are applied to the amplifier 15 for the transmission to the output conductor 16 through the parallel-to-series convertor 14 and on the other hand to the digital-to-analog convertor 53 for processing in the auxiliary receiver 55 which, for the linear quantization of the auxiliary signal used here is constructed in a particularly simple manner. It is in particular composed of the non-linear impedance 57 as series impedance and a capacitor 66, which functions as an integrator as shunt impedance. Also in the network 57, 56 shown the integrator output signal is separated by means of subtraction as local auxiliary signal from the analog output signal of the digital-to-analog convertor 53 whereafter through the non-linear network 57, by means of integration in the shunt capacitor 66 the desired integrator output signal is obtained which is applied to the differential signal shaper 42 and the combination device 50 after amplification in an amplifier 67 having a suitable gain factor.

Just as with the transmitter construction in FIG. 11 the presence of the auxiliary signal in the output signal of the digital-to-analog convertor 53 attends to compensating the leakage phenomena in the shunt capacitor 66, which operates as an integrator, which phenomena would otherwise result in non-linear distortions.

FIG. 14 shows the receiver which is associated with the transmitter in FIG. 13.

In exactly the same manner as in the auxiliary receiver 55 in the receiver shown, the composite code groups are converted in parallel form at the output of the series-to-parallel convertor 18 in the digital-to-analog convertor 53' into the corresponding analog signal which is applied via the non-linear impedance 57' for signal expansion to the shunt capacitor 66' which functions as an integrator. Thus at the shunt capacitor 66' the transmitted television signals are obtained which are displayed in the display tube 27 via the amplifier 25 and low pass filter 26.

Extensive trials have taught that in this extremely simple realization of the transmission system according to the invention, with the saving of the polarity pulse in the transmitted code groups and the direct correction of transmission errors an excellent reproduction quality is realized. It appears that perturbing side effects in the reproduction, for example ringing phenomena do not occur in this construction, which also applies to all previous constructions, not even at very steep transitions in the television signal.

It appeared that in the practical embodiment of the transmitters and receivers according to the invention shown in the FIGS. 11 – 14 excellent results were realized by using the non-linear impedance in FIG. 15 instead of the non-linear impedance 46, 57, 57', 60 and 60' in the signal compression and the signal expansion networks for the analog differential television signals. As FIG. 15 illustrates the non-linear impedance is constituted by a series resistor 68 to which two parallel branches 69, 70 are connected, the one branch 69 comprising two diodes 71, 72 which are connected in anti-parallel, the other branch 70 also comprising, via a series resistor 73 two diodes 74, 75, which are also connected in anti-parallel and which are also shunted by a parallel resistor 76.

The most important data of the non-linear impedance illustrated in FIG. 15 are listed here below.

Resistor 68: 1 K Ω Diodes 71, 72: BAX 13
Resistor 73: 2,7 K Ω
Resistor 76: 15 K Ω Diodes 74, 75: Schottky diodes FH1100

For completeness it should be noted that instead of the analog-to-digital convertors and digital-to-analog convertors with parallel signal processing also analog-to-digital convertors and digital-to-analog convertors having series signal processing may be used. The transmission systems shown in FIG. 11, FIG. 14 can also be constructed in a simple manner for other discrete manners of transmission, particularly by replacing the analog-to-digital convertor 52 and the digital-to-analog convertors 53, 53' by discrete amplitude modulators and demodulators, discrete phase modulators and demodulators and such like.

What is claimed is:

1. A transmitter for the transmission of an analog information signal in a digital format comprising:
    an input terminal means for receiving said analog signal;
    a subtractor having a first input coupled to said input terminal, a second input, and an output;
    a first encoder means coupled to the output of said subtractor for encoding with a non-linear quatizing scale;
    an output terminal means coupled to the output of said encoder for providing said digital format
    sampling means coupled between the input terminal means and the output of said encoder
    a prediction circuit having an input coupled to the subtractor output and having an output coupled to the second subtractor input, said prediction circuit comprising a first adder circuit having a first input coupled to said prediction circuit input, a second input and an output; delay means having an input coupled to the adder circuit output, and having an output coupled to said prediction circuit output and to the second adder circuit input;
    a second adder circuit having a first input and an output coupled between said subtractor output and said output terminal, and having a second input; and
    an auxiliary circuit arrangement means for providing a signal that reduces transmission errors having an input coupled to one of the inputs of the subtractor and having an output coupled to the second input of the second circuit.

2. A transmitter as claimed in claim 1, wherein the auxiliary circuit arrangement comprises a delay circuit having an input coupled to the auxiliary circuit arrangement input, said auxiliary circuit input being coupled to the first input of said subtractor.

3. A transmitter as claimed in claim 1, wherein the auxiliary circuit arrangement input is coupled to the second subtractor input.

4. A transmitter as claimed in claim 1, wherein said auxiliary circuit arrangement comprises limiting means coupled between the auxiliary circuit arrangment input and output.

5. A transmitter as claimed in claim 1, wherein said auxiliary circuit arrangement comprises non-linear compression means coupled between the auxiliary circuit arrangement input and output.

6. A transmitter as claimed in claim 5, further comprising a second encoder coupled between said compression means and the auxiliary circuit arrangement output.

7. A receiver for the reception of an analog signal transmitted in a digital format comprising:

an input channel having terminal means for receiving said digital format, an output terminal means for providing said analog signal, and a digital to analog converter coupled to one of said terminal means; said receiver further comprising a subtractor circuit having a first input coupled to said input terminal means, a second input, and an output coupled to said channel, and a prediction circuit having an input and an output coupled between said input and output terminal;

said prediction circuit comprising an adder circuit having a first input coupled to the prediction circuit input, a second input and an output; delay means having an input coupled to the adder circuit output and having an output coupled to said prediction circuit output and to the adder circuit second input; and an auxiliary circuit arrangement means for providing an auxiliary signal that reduces transmission errors having an input coupled to the prediction circuit output and having an output coupled to the second input of the subtractor circuit.

8. A receiver as claimed in claim 7, further comprising limiting means coupled between the auxiliary circuit arrangement input and output.

9. A receiver as claimed in claim 7, further comprising non-linear compression means coupled in cascade between the auxiliary circuit arrangement input and output.

10. A receiver as claimed in claim 9, further comprising an encoder means coupled between said compression means and the auxiliary circuit arrangement output for encoding said auxiliary signal into selected pulse code groups.

* * * * *